(12) United States Patent
Mohri et al.

(10) Patent No.: US 6,709,791 B1
(45) Date of Patent: Mar. 23, 2004

(54) HALFTONE PHASE SHIFT PHOTOMASK AND BLANKS FOR HALFTONE PHASE SHIFT PHOTOMASK FOR IT AND PATTERN FORMING METHOD USING THIS

(75) Inventors: Hiroshi Mohri, Tokyo (JP); Toshiaki Motonaga, Tokyo (JP); Chiaki Hatsuta, Tokyo (JP); Norihito Ito, Tokyo (JP); Naoya Hayashi, Tokyo (JP); Toshio Onodera, Yokohama (JP); Takahiro Matsuo, Yokohama (JP); Toru Ogawa, Yokohama (JP); Keisuke Nakazawa, Yokohama (JP)

(73) Assignees: Dai Nippon Printing Co., Ltd., Tokyo (JP); Semiconductor Leading Edge Technologies, Inc., Yokohama (JP)

( * ) Notice: Subject to any disclaimer, the term of this patent is extended or adjusted under 35 U.S.C. 154(b) by 0 days.

(21) Appl. No.: 09/807,276
(22) PCT Filed: Aug. 16, 2000
(86) PCT No.: PCT/JP00/05472
§ 371 (c)(1),
(2), (4) Date: Apr. 10, 2001
(87) PCT Pub. No.: WO01/13178
PCT Pub. Date: Feb. 22, 2001

(30) Foreign Application Priority Data

Aug. 18, 1999 (JP) .......................................... 11-231180

(51) Int. Cl.[7] ................................................ G03F 9/00
(52) U.S. Cl. ......................................................... 430/5
(58) Field of Search ........................... 430/5, 322, 325, 430/330

(56) References Cited

U.S. PATENT DOCUMENTS

| 5,380,608 A | * | 1/1995 | Miyashita et al. | 430/5 |
|---|---|---|---|---|
| 5,403,683 A | | 4/1995 | Ohta et al. | |
| 5,629,115 A | | 5/1997 | Kawano et al. | 430/5 |
| 5,738,959 A | * | 4/1998 | Miyashita et al. | 430/5 |
| 6,004,699 A | * | 12/1999 | Yasuzato et al. | 430/5 |
| 6,355,385 B1 | * | 3/2002 | Takahashi | 430/5 |

FOREIGN PATENT DOCUMENTS

| JP | 9-43830 | 2/1997 |
| JP | 9-244212 | 9/1997 |
| JP | 11-26355 | 1/1999 |

OTHER PUBLICATIONS

Patent Abstracts of Japan vol. 1998, No. 01 Jan. 30, 1998 abstract.
Patent Abstracts of Japan vol. 009, No 232 (P–389) Sep. 18, 1985.

* cited by examiner

Primary Examiner—S. Rosasco
(74) Attorney, Agent, or Firm—Dellett & Walters

(57) ABSTRACT

The invention relates to a halftone phase shift photomask whose transmittance and phase angle remain unchanged even when irradiated with an excimer laser used for exposure over an extended period of time, and a blank therefor, and provides a halftone phase shift mask 108 comprising a pattern of halftone phase shift film 102 containing at least chromium and fluorine on a transparent substrate 101, wherein optical characteristic changes upon irradiation with an exposure excimer laser have been reduced by patterning a film irradiated with light 109 having a wavelength substantially absorbed by halftone phase shift film 102.

26 Claims, 16 Drawing Sheets

HALFTONE PHASE SHIFT PHOTOMASK AND BLANKS FOR HALFTONE PHASE SHIFT PHOTOMASK FOR IT AND PATTERN FORMING METHOD USING THIS

This application is a 371 of PCT/JP00/05472, Aug. 16, 2000.

The present invention relates generally to a photomask used for the fabrication of high-density integrated circuits such as LSIs, a photomask blank for the fabrication of such a photomask and a pattern-formation process using the same, and more particularly to a halftone phase shift photomask that enables projected images of minute size to be obtained, a halftone phase shift photomask blank for the fabrication of this halftone phase shift photomask and a pattern-formation process using the same.

BACKGROUND ART

Semiconductor integrated circuits such as LSIs are fabricated by the repetition of a so-called lithography process using a photomask. Possible applications of such phase shift masks as set forth in JP-A 58-173744, JP-B 62-59296, etc. to the formation of microcircuits in particular have already been under investigation. Among others, the so-called halftone phase shift photomask such as one set forth in U.S. Pat. No. 4,890,309, etc. has attracted attention in view of expedited practical applications. For instance, as disclosed in JP-A's 05-2259 and 05-127361, some proposals have been made in respect of arrangements and materials improved in yields and reduced in costs for the purpose of practical applications.

Here a typical halftone phase shift photomask is briefly explained with reference to FIGS. 14 and 15. FIGS. 14(a) through 14(d) are illustrative of the principles of halftone phase shift lithography, and FIGS. 15(a) through 15(d) are illustrative of a conventional process. FIGS. 14(a) and 15(a) are each a sectional view of a photomask, FIGS. 14(b) and 15(b) are each illustrative of the amplitude of light on the photomask, FIGS. 14(c) and 15(c) are each illustrative of the amplitude of light on a wafer, and FIGS. 14(d) and 15(d) are each illustrative of the intensity of light on the wafer. Reference numerals 911 and 921 are each a transparent substrate, 922 a 100% light-blocking film, 912 a halftone phase shift film, and 913 and 923 are each incident light. By the term "halftone phase shift film" used herein is intended a film, in a single layer or multilayer form, having functions of substantially reversing the phase of transmitting exposure light with respect to the phase of exposure light passing through the air having the same optical length and attenuating the intensity of the light. According to the conventional process, the 100% light-blocking film 922 formed of Cr or the like is provided on the substrate 921 formed of quartz glass or the like, as shown in FIG. 15(a), thereby achieving a simple arrangement where a light transmitting portion of any desired pattern is formed. The light on the wafer has such a fan-shaped intensity distribution as shown in FIG. 15(d), resulting in poor resolution. With the halftone phase shift lithography, on the other hand, it is possible to achieve improvements in resolution, because the phase of light transmitting through the halftone phase shift mask 912 is substantially reversed with respect to the phase of light transmitting through its opening, so that the intensity of light at pattern boundaries on the wafer is reduced to zero and, hence, such a fan-shaped intensity distribution is prevented.

It is here worthy of note that various factors needed for a conventional photomask such as the dimensional accuracy, alignment accuracy, etc. of the pattern formed on the mask as well as its phase angle and transmittance are of vital importance so as to make use of the effect of the halftone phase shift photomask, and these factors are determined by the refractive index, extinction coefficient and thickness of the single layer or multilayer forming the halftone phase shift film.

In general, the optimum phase angle is 180°, and the optimum transmittance is in the range of 1 to 20% (100% for the opening) as determined depending on the pattern to be transferred, transfer conditions, etc. A halftone phase shift mask must be fabricated in such a way as to meet its optimum phase angle and transmittance. Any deviation from the optimum values leads to changes in the correct exposure, etc., ending up with dimensional accuracy drops, a limited tolerance to focus, etc. Thus, the refractive index, extinction coefficient, thickness accuracy and thickness stability of the single layer or multilayer forming the halftone phase shift mask are of vital importance. FIGS. 17 and 18 are illustrative of the results of simulation of what influences are produced by transmittance and phase difference changes on the depth of focus, transfer size and best focus change in lithography using a halftone phase shift mask.

In this regard, it is noted that as the pattern to be formed becomes fine, it is required to make short the wavelength of exposure light used for lithography, and the KrF excimer lasers of 248 nm wavelength are now put to practical use for patterns finer than the so-called 0.25 $\mu$m design rule. With expected further size reductions in view, ArF excimer lasers of 193 nm wavelength are under investigation. For halftone phase shift films used for halftone phase shift masks, too, the development of materials capable of achieving the optimum phase angle and transmittance for these wavelengths and having stable refractive indices and extinction coefficients are in great demand.

To meet such demands, for instance, it has been proposed to use a film composed mainly of chromium and containing fluorine for a halftone phase shift mask as typically disclosed in JP-A 07-110572. The merits of this film are that the ranges of phase angle and transmittance needed at those wavelengths cannot only be ensured but blank fabrication, mask-making processing, etc. can also be achieved as is the case with a conventional photomask. For these reasons, the film has already been passed from an early investigation stage into a practical stage.

A problem with the halftone phase shift mask composed mainly of chromium and containing fluorine is, however, that its refractive index and/or its extinction coefficient change upon long-term irradiation with exposure light such as an ArF excimer laser. In other words, with a resist pattern formed using a halftone phase shift photomask having the halftone phase shift film composed mainly of chromium and containing fluorine, its transmittance and/or its phase angle change whenever it is used.

From the results of simulation shown in FIGS. 17 and 18, however, it is found that even slight fluctuations in the phase difference and transmittance of a halftone phase shift photomask result in large changes in focus position and tolerance to focus, to say nothing of transfer size.

That is, whenever this mask is used, the proper exposure changes with limited dimensional accuracy and limited tolerance to focus. Alternatively, even when the mask is used once alone, there is a possibility of changes in these factors, resulting in a limited tolerance to pattern formation and deterioration of pattern shape.

SUMMARY OF THE INVENTION

In view of such states of the prior art as mentioned above, an object of the present invention is to provide a halftone phase shift mask which does not vary in its refractive index and phase angle even upon irradiation with excimer laser used for exposure over an extended period of time, a blank for the fabrication of the same, and an image-formation process using the same.

The present invention has been accomplished as a result of studies made so as to develop a halftone phase shift film which does not vary in its refractive index and phase angle even upon irradiation with excimer laser used for exposure over an extended period of time.

According to the first aspect of the present invention, there is provided a halftone phase shift mask blank comprising a halftone phase shift film containing at least chromium and fluorine on a transparent substrate, characterized in that:

optical characteristic changes upon irradiation with an exposure excimer laser have been reduced by application of light of a wavelength substantially absorbed by said halftone phase shift film.

According to the second aspect of the present invention, there is provided a halftone phase shift mask blank comprising a halftone phase shift film containing at least chromium and fluorine on a transparent substrate, characterized in that:

a protective film has been provided on said halftone phase shift mask to reduce optical characteristic changes upon irradiation with an exposure excimer laser.

According to the third aspect of the present invention, there is provided a halftone phase shift mask blank comprising a halftone phase shift film containing at least chromium and fluorine on a transparent substrate, characterized in that:

optical characteristic changes upon irradiation with an exposure excimer laser have been reduced by application of light of a wavelength substantially absorbed by said halftone phase shift film, and provision of a protective layer on said halftone phase shift mask.

Preferably in the halftone phase shift mask blank according to the first or third aspect of the present invention, a stabilized film has been formed on the surface of the halftone phase shift film by the application of light having a wavelength substantially absorbed by the halftone phase shift mask.

It is also desired that the protective film contain at least chromium and fluorine with the content of fluorine being smaller than that in the halftone phase shift mask. In addition, it is desired that the protective film be a transparent film. To this end, for instance, the transparent film may be composed mainly of a silicon oxide.

According to the fourth aspect of the present invention, there is provided a halftone phase shift mask comprising a halftone phase shift film pattern containing at least chromium and fluorine on a transparent substrate, characterized in that:

optical characteristic changes upon irradiation with an exposure excimer laser have been reduced by patterning of a film irradiated with light having a wavelength substantially absorbed by said halftone phase shift film.

According to the fifth aspect of the present invention, there is provided a halftone phase shift mask comprising a halftone phase shift film pattern containing at least chromium and fluorine on a transparent substrate, characterized in that:

optical characteristic changes upon irradiation with an exposure excimer laser have been reduced by application of light having a wavelength substantially absorbed by said halftone phase shift film after patterning of said halftone phase shift film.

According to the sixth aspect of the present invention, there is provided a halftone phase shift mask comprising a halftone phase shift film pattern containing at least chromium and fluorine on a transparent substrate, characterized in that:

optical characteristic changes upon irradiation with an exposure excimer laser have been reduced by provision of a protective film pattern on said halftone phase shift film.

According to the seventh aspect of the present invention, there is provided a halftone phase shift mask having a halftone phase shift film pattern containing at least chromium and fluorine on a transparent substrate, characterized in that:

optical characteristic changes upon irradiation with an exposure excimer laser have been reduced by provision of a protective film on the whole surface of said mask after patterning of said halftone phase shift film.

Preferably in the halftone phase shift photomask according to the fourth aspect of the present invention, the optical characteristic changes upon irradiation with an exposure excimer laser have been reduced by applying the light having a wavelength substantially absorbed by the halftone phase shift film, then providing a protective film thereon, and finally patterning the protective film and halftone phase shift film.

In the halftone phase shift photomask according to the fourth aspect of the present invention, it is also preferable that the optical characteristic changes upon irradiation with an exposure excimer laser have been reduced by applying the light having a wavelength substantially absorbed by the halftone phase shift film, then patterning the film, and finally providing a protective film on the whole surface thereof.

Preferably in the halftone phase shift photomask according to the fifth aspect of the present invention, the optical characteristic changes upon irradiation with an exposure laser have been reduced by irradiating a patterned halftone phase shift film with the light having a wavelength substantially absorbed by said film, and then providing a protective film on the whole surface thereof.

It is also preferable that a stabilized film has been formed on the surface of the halftone phase shift film in contact with outside air by the application of the light having a wavelength substantially absorbed by said halftone phase shift film.

In addition, it is preferable that the protective film contain at least chromium and fluorine with the content of fluorine being smaller than that in the halftone phase shift film.

Further, it is preferable that the protective film be a transparent film. To this end, for instance, the transparent film may be formed mainly of a silicon oxide.

Furthermore, it is preferable that when the pattern is formed, the pattern size be smaller than target size.

It is here noted that the present invention comprises a pattern-formation process using any one of the aforesaid halftone phase shift masks.

Why such arrangements as mentioned above are used in the present invention, and how they work is now explained. FIGS. 16(a) and 16(b) are illustrative of how the phase difference and transmittance of a halftone phase shift photomask containing at least chromium and fluorine change due to exposure to an excimer laser. That is, the changes in the phase difference and transmittance of a halftone phase shift film 5 with respect to the total applied energy are shown provided that using an irradiator as schematically shown in FIG. 8, a halftone phase shift film 5 located in a sample chamber 3 was irradiated from the side of a glass substrate 4 with ArF excimer laser light (hereinafter called simply the laser) 2 from an ArF excimer laser system 1 under the conditions of pulse energy: 0.2 mJ/cm$^2$/pulse, repetitive frequency: 1 kHz, and irradiation atmosphere: the air. Here the phase difference and transmittance were measured using MPM Phase Difference Meter, Laser Tech Co., Ltd.

To track down the cause of why the phase angle and transmittance of the halftone phase shift film containing at least chromium and fluorine change by the aforesaid ArF excimer laser irradiation, the composition of this halftone phase shift film was analyzed by X-ray photoelectron spectroscopy before and after the exposure light irradiation. The results are set out in Table 1 in the form of the ratio of atoms found in %. Here, the halftone phase shift film was irradiated with the ArF excimer laser under the conditions of pulse energy: 0.2 mJ/cm$^2$/pulse, total applied energy: 21.6 kJ/cm$^2$, repetitive frequency: 1 kHz, and irradiation atmosphere: the air. X-ray photoelectron spectroscopy was carried out using ESCALAB210, VG SCIENTIFIC Co., Ltd. The in-film composition was analyzed after the film had been half etched by means of Ar ion beams.

TABLE 1

Film Composition Before and After Exposure Light IRRADIATION (XPS Analysis)

|  |  | Cr | F | C | O |
|---|---|---|---|---|---|
| On Film Surface | Before Exposure | 14 | 27 | 31 | 28 |
|  | After Exposure | 14 | 17 | 34 | 35 |
| In Film | Before Exposure | 25 | 55 | 10 | 10 |
|  | After Exposure | 25 | 55 | 10 | 10 |

As can be seen from the table, there is no noticeable change in the composition of the substantial portion of the halftone phase shift film by ArF excimer laser irradiation. However, the surface of the film changes in quality; the content of fluorine decreases with an increasing content of oxygen. Thus, the cause of the changes in the phase difference and transmittance are believed to be the quality change found in the vicinity of the film surface.

Referring here to the changes in the phase difference and transmittance due to ArF excimer laser irradiation of the halftone phase shift photomask having a halftone phase shift mask containing at least chromium and fluorine, it is worth of note that, as can be seen from FIG. 16, the amounts of the changes in both the phase difference and the transmittance are large from the initiation of irradiation up to the total applied energy of 2.5 kJ/cm$^2$, but they are relatively stabilized after the total applied energy has reached 2.5 kJ/cm$^2$. It is thus found that if the ArF excimer laser irradiation corresponding to this is carried out in the process of mask fabrication so as to allow the surface composition of the film to previously change as mentioned above, it is then possible to reduce the amount of the subsequent change to an extremely low level.

In the present invention, therefore, the halftone phase shift photomask having a halftone phase shift film containing at least chromium and fluorine is irradiated, for instance, with the same excimer laser as the exposure light before used for exposure, so that the surface of the film is previously allowed to change in quality, thereby reducing the changes in the phase difference and transmittance of the film after the initiation of exposure. When ArF excimer laser irradiation is used for this stabilization, it is found from FIG. 16 that the previous application of the total applied energy of 2.5 kJ/cm$^2$ are sufficient to this end.

While an excimer laser similar to that actually used for exposure may be used for irradiation, it is understood that another light may be used with the proviso that it can be substantially absorbed by the halftone phase shift film. For instance, high pressure mercury-vapor lamps, xenon lamps, and deuterium lamps may be used for light sources. The irradiation of the halftone phase shift film with light may be carried out, with the same effect, from either the front or back side thereof. The irradiation should preferably be carried out in the air. However, this irradiation could be carried out, with the same effect, whether in a nitrogen atmosphere or in vacuum. The irradiation may be carried out simultaneously with the application of heat. In any case, it is only required to find the correlation between the total applied energy and the changes in transmittance and phase angle, as shown in FIG. 16, and apply the amount of energy greater than its point of inflection.

It is here noted that this irradiation is not necessarily carried out after completion of the photomask fabrication process. In other words, the irradiation may be carried out at any time before the formation of a resist pattern using this photomask. For instance, the irradiation may be performed, with the same effect, whether in the process of making a photomask blank before forming the desired pattern or after the desired pattern has been formed. It follows that even when the irradiation is performed at any step after the halftone phase shift mask containing at least chromium and fluorine has been formed and before completion of the photomask, it is possible to reduce the changes in the transmittance and phase angle due to the aforesaid exposure.

When a halftone phase shift photomask having a stabilized phase difference and transmittance is actually fabricated according to the process of the present invention, it is preferable to form a halftone phase shift film on a transparent substrate while its phase angle and transmittance are determined in consideration of the aforesaid amount of change due to irradiation for stabilization.

The present invention is also concerned with the provision of a protective film for preventing the aforesaid film quality change on the surface of a halftone phase shift film. By providing an arrangement for preventing the film quality change inherent in the vicinity of the film surface as shown in Table 1, too, it is again possible to reduce the aforesaid changes in phase angle and transmittance due to exposure light irradiation.

Preferable for this protective film, for instance, is a film transparent to exposure light such as an SiO$_2$ film. The protective film does not only undergo such surface changes as shown in Table 1 even by irradiation with exposure light such as an ArF excimer laser but has also a function of preventing a halftone phase shift film containing at least chromium and fluorine from changing in quality, viz., decreasing in the content of fluorine with an increasing content of oxygen. It is thus possible to prevent the changes in the phase angle and transmittance of the halftone phase shift photomask due to exposure light irradiation.

For the protective film, transparent films formed of metal fluorides and oxides such as MgF$_2$, CaF$_2$, LiF$_2$, Al$_2$O$_3$, TiO$_2$, ZrO$_2$, HfO$_2$, Ta$_2$O$_5$, ZnO, MgO and Mg$_2$O$_5$, to say nothing of the aforesaid SiO$_2$, as well as and oxides of metal silicides such as CrSi, MoSi and WSi may be used. The desired effect of this protective film is achievable irrespective of where in the process of photomask fabrication it is formed. However, the protective film should be formed after the formation of the halftone phase shift film on the transparent substrate.

It is acceptable to use for the protective film a film translucent to exposure light, for instance, thin films formed of metals such as Mo and Cr. Preferably in this case, however, the translucent protective film should be formed before the photomask blank is processed into the desired pattern, and then processed into the same pattern simultaneously with the processing of the halftone phase shift film or at a separate step.

In any case, the halftone phase shift film should be formed in such a way that when the protective film is provided, its transmittance and phase angle have the desired correlation between the opening portion and the pattern portion. When it is expected that the halftone phase shift film may be formed even on a section with the pattern formed thereon, for instance, when the halftone phase shift film is previously processed into the desired pattern followed by the provision of the protective film, the halftone phase shift film should preferably be formed with modification of pattern size in consideration of a possible change in transfer size due to transfer thereof to the section.

When the halftone phase shift film containing at least chromium and fluorine has substantially a multilayer structure, it is also effective to locate on the uppermost surface thereof a film that is most unlikely to undergo the aforesaid surface changes due to exposure light. Referring here to a multilayer film containing at least chromium and fluorine, in general, the more the content of fluorine, the more the content of oxygen is due to the aforesaid exposure, with a decreasing content of fluorine. In this case, it is desired to locate a film with a decreased content of fluorine on the surface of the multilayer structure.

The application of the light having a substantially absorbed wavelength and the formation of the protective film—for the purpose of reducing the changes in transmittance and phase angle of the halftone phase shift film containing at least chromium and fluorine due to irradiation with exposure light such as an ArF excimer laser—have substantially the invariable effect irrespective of when carried out singularly or simultaneously. Generally in this case, it is noted that as far as the obtained effect is concerned, which of the application of the light having a substantially absorbed wavelength and the formation of the protective film is first carried out is of no precedence, and that they may be carried out somewhere in the process of photomask fabrication.

Thus, the present invention relates to a halftone phase shift photomask wherein a halftone phase shift film containing at least chromium and fluorine is formed on a transparent substrate. By irradiation with light having a wavelength substantially absorbed by this halftone phase shift film, thereby modifying the surface film quality thereof, it is possible to stabilize the transmittance and phase difference thereof with respect to irradiation with exposure light such as an ArF excimer laser.

By providing a protective film on the surface of the halftone phase shift film, it is also possible to prevent any change in the surface quality of the aforesaid halftone phase shift photomask due to irradiation with exposure light such as an ArF excimer laser and, hence, stabilize the transmittance and phase difference thereof with respect to exposure light irradiation.

The modification of these films or the provision of the protective film ensures that the halftone phase shift photomask is reduced in terms of the change in transmittance and phase angle during its storage or use, and eliminates or reduces various problems arising whenever the halftone phase shift mask is used such as a variation in the correct exposure, decreased dimensional accuracy, limited focus tolerance. limited pattern-formation tolerance, and degradation of pattern shape.

BEST MODE FOR CARRYING OUT THE INVENTION

The halftone phase shift photomask and halftone-phase shift photomask blank according to the present invention are now explained specifically with reference to their examples.

EXAMPLE 1

Figure 1A:
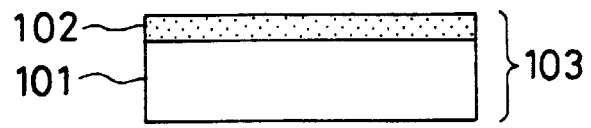
FIGS. 1(a) through 1(f) are illustrative of steps of fabricating a halftone phase shift mask blank according to Example 1 of the invention, and steps of processing the blank to obtain a halftone phase shift photomask.

Examples of the halftone phase shift photomask and halftone phase shift photomask blank according to the present invention are explained with reference to FIGS. 1(a) through 1(f). As shown in FIG. 1(a), a halftone phase shift film 102 containing chromium and fluorine is formed on an optically polished, well-washed synthetic quartz substrate 101 by means of sputtering under the following conditions, thereby obtaining a halftone phase shift photomask blank 103.

Sputtering system: DC magnetron sputtering system
Target: Metallic chromium
Gases and flow rates: Argon gas 76 sccm plus carbon tetrafluoride gas 24 sccm
Sputtering pressure: 3.0 millitorr
Sputtering current: 5.5 amperes Here the formed halftone phase shift film 102 had a thickness of 135 nm.

Figure 1B:
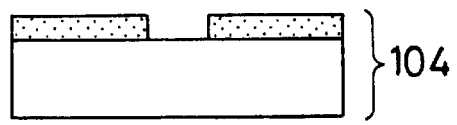

Apart from this, a sample 104 for measuring phase difference and transmittance, as shown in FIG. 1(b), was prepared by forming the halftone phase shift film 102 on the synthetic quartz substrate 101 at the same thickness under the same conditions, and patterning the halftone phase shift film by conventional lithography. By measurement on a phase shift mask phase difference meter (MPM193, Laser Tech Co., Ltd.), the phase difference and transmittance at 193 nm wavelength of the halftone phase shift film was found to be about 182° and about 10%, respectively.

Figure 1C:
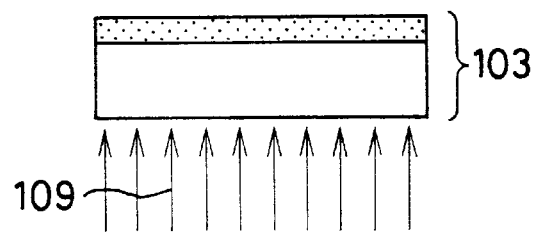
Figure 1D:
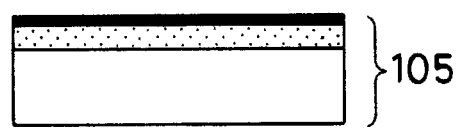
Figure 8:
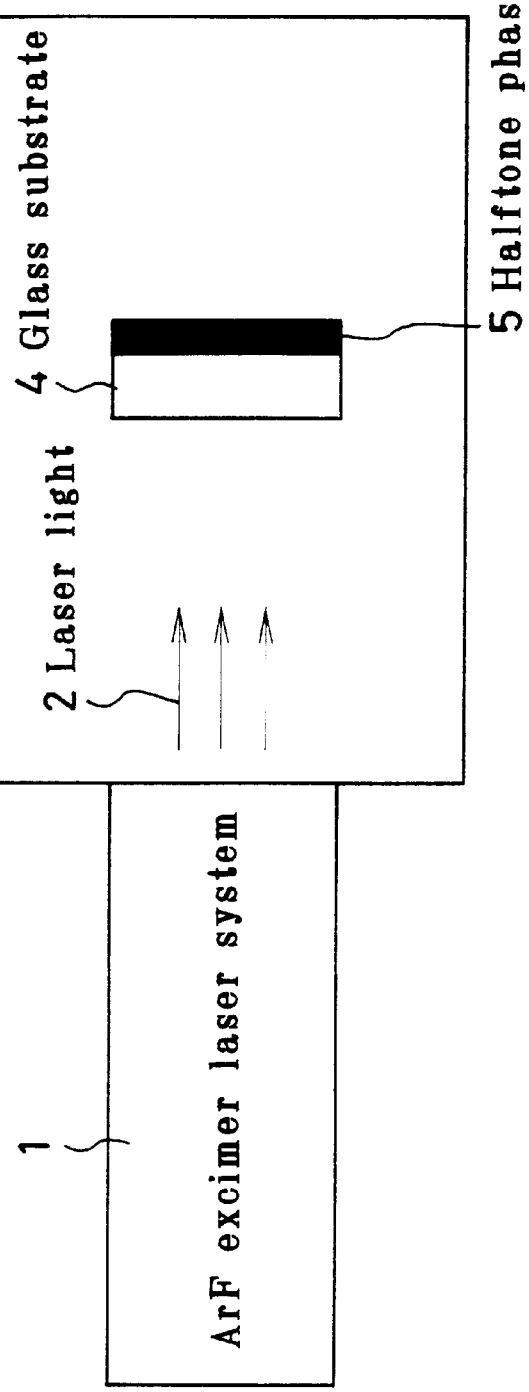
FIG. 8 is a schematic illustrative of an ArF excimer laser irradiator.

Using the irradiator shown in FIG. 8, the halftone phase shift photomask 103 was irradiated with laser light 109 of 193 nm wavelength, as shown in FIG. 1(c), thereby obtaining such a halftone phase shift mask blank 105 as shown in FIG. 1(d), which enabled the photomask to be used while its optical characteristic change was much reduced. The irradiation was carried out under the following conditions.

Light source: ArF excimer laser
Irradiation atmosphere: Nitrogen:oxygen=80:20
Pulse energy: 0.2 mJ/cm$^2$/pulse
Total energy: 2.5 kJ/cm$^2$ The blank 103 was irradiated with the laser from the direction of the substrate 101.

The aforesaid phase difference and transmittance-measuring sample 104 was irradiated under the aforesaid conditions to measure its phase difference and transmittance at 193 nm wavelength, which were found to be about 180° and about 11.5%, respectively.

Figure 9:
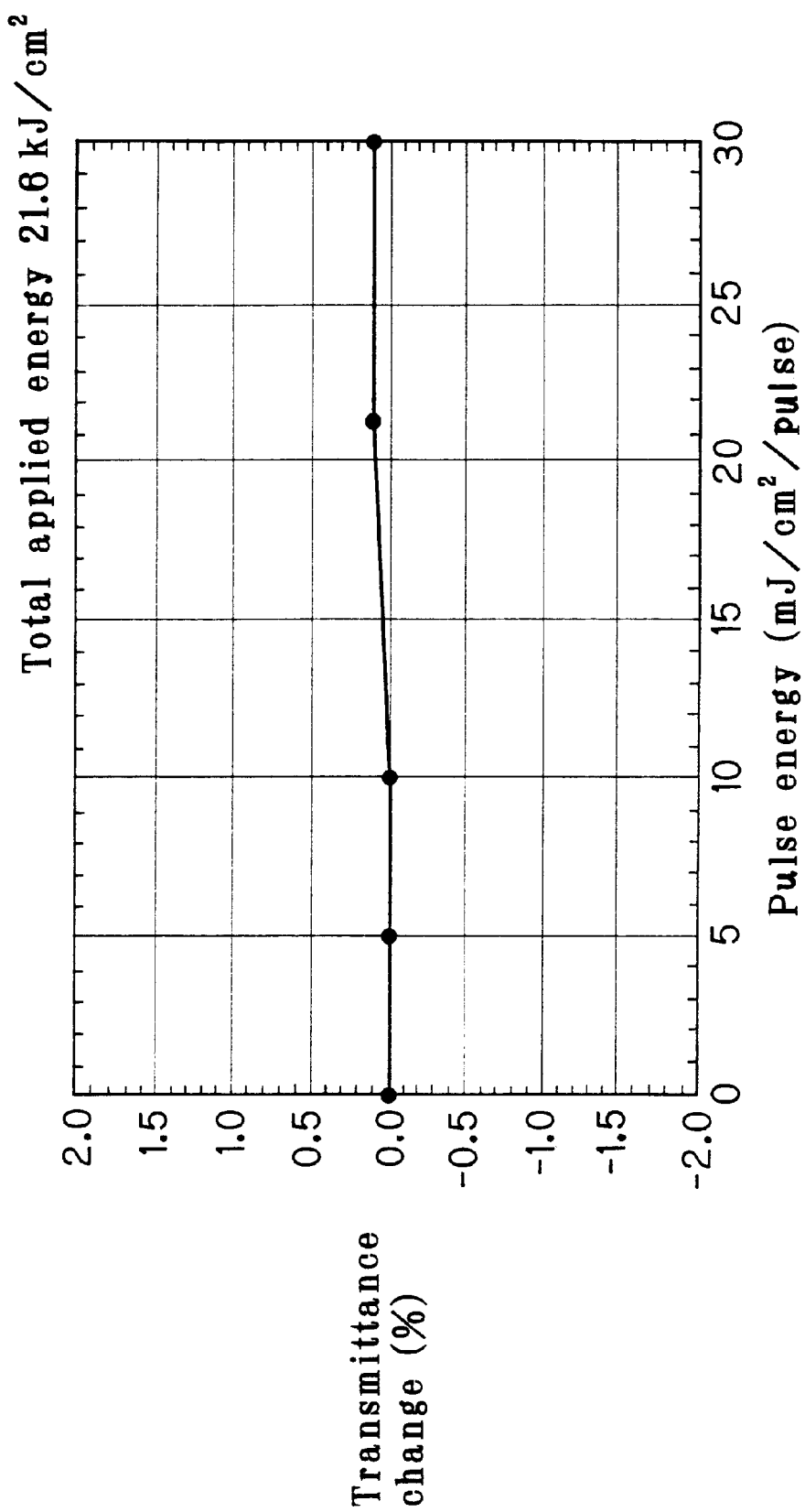
FIG. 9 is a graphical representation illustrative of the results of experimentation on the resistance to ArF excimer laser irradiation of the halftone phase shift photomask according to Example 1 of the invention.
Figure 16A:
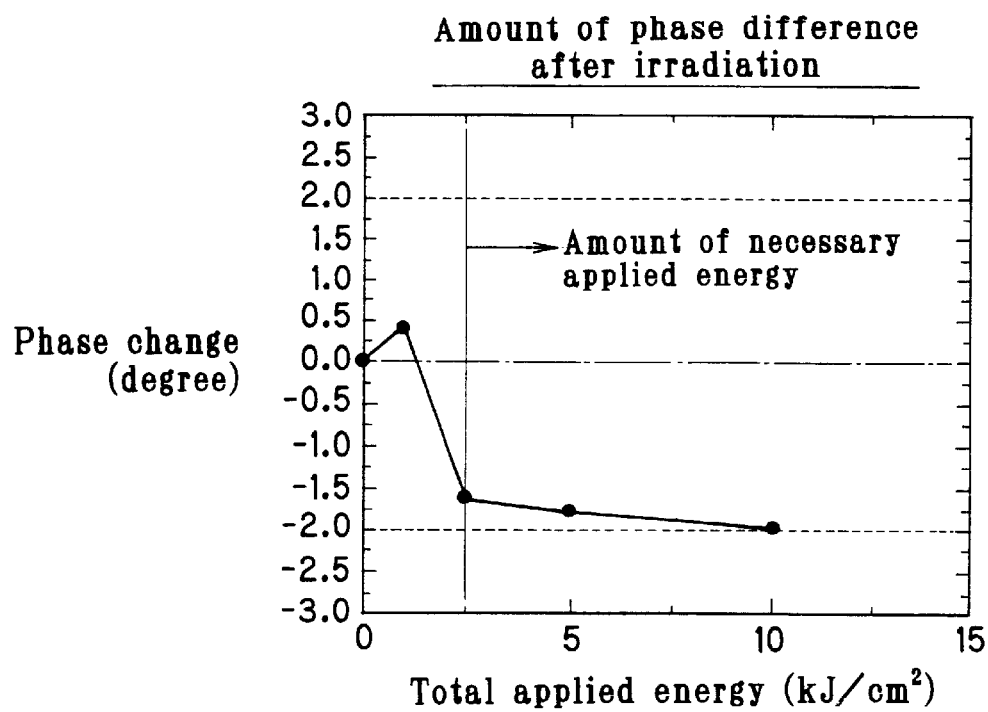
FIGS. 16(a) and 16(b) are graphical representations illustrative of how the phase difference and transmittance of a halftone phase shift photomask having a halftone phase shift film containing chromium and fluorine change due to excimer laser irradiation.
Figure 16B:
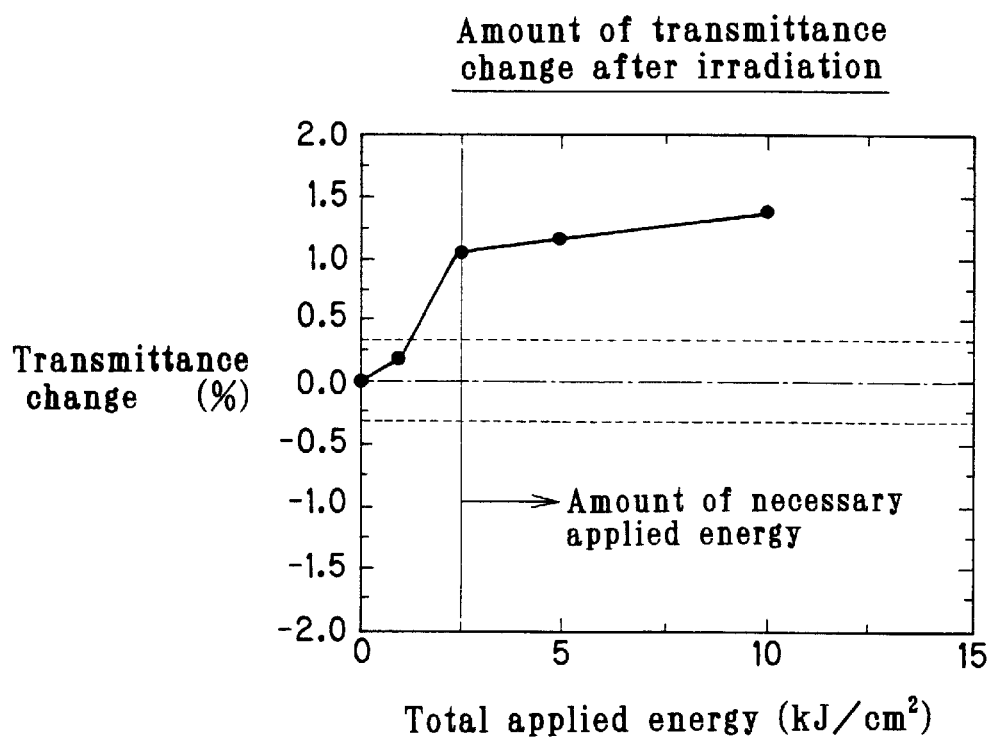
Figure 17:
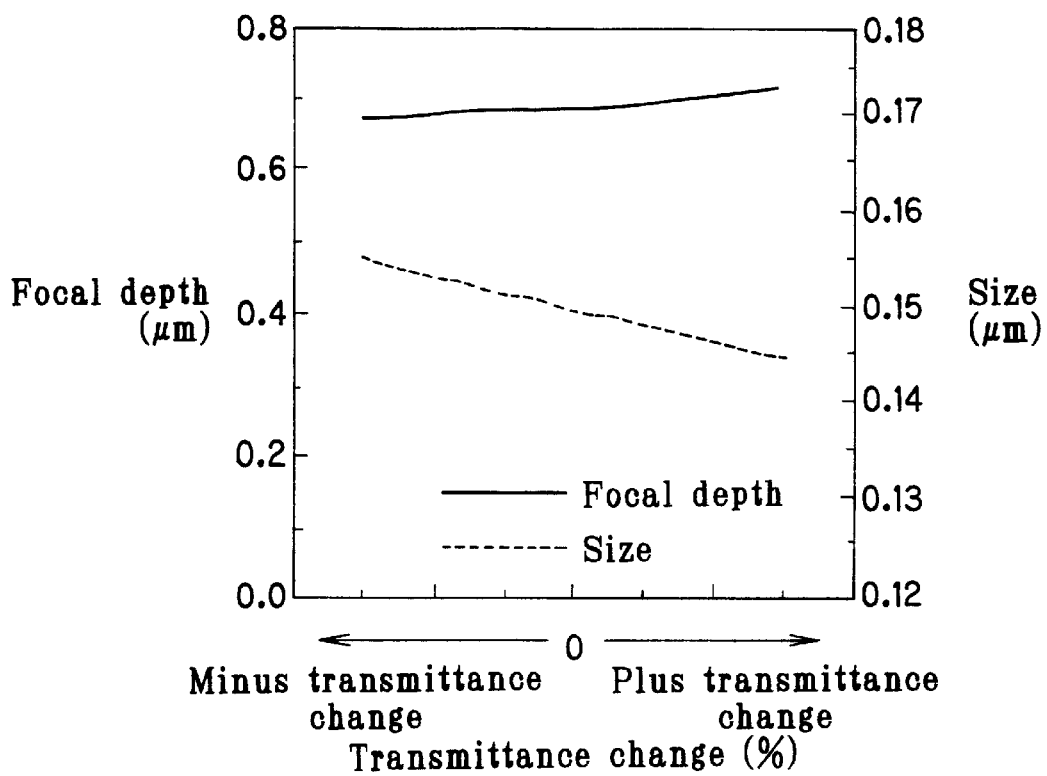
FIG. 17 is a graphical representation illustrative of influences that transmittance changes have on the depth of focus and transfer size in lithography using a halftone phase shift photomask.
Figure 18:
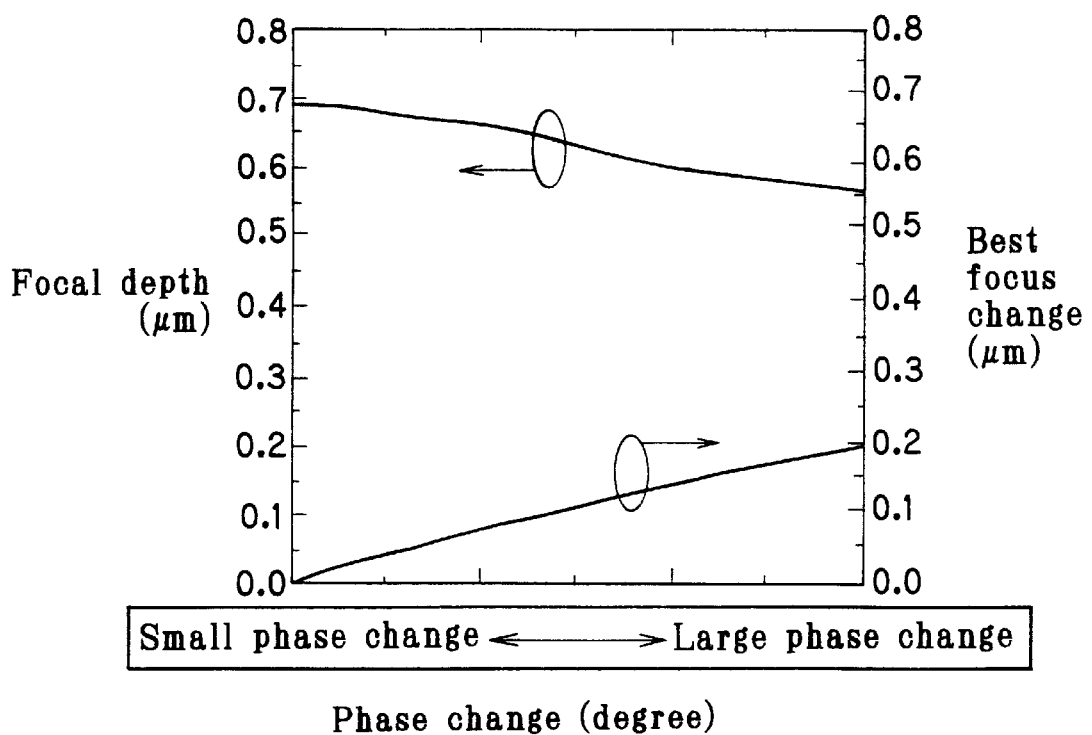
FIG. 18 is a graphical representation illustrative of influences that phase difference changes have on the depth of focus and the best focus change in lithography using a halftone phase shift photomask.

Changes in the transmittance of the thus obtained halftone phase shift photomask blank 105 due to ArF excimer laser irradiation are shown in FIG. 9. It is found that this halftone phase shift photomask blank 105 is much reduced in terms of the changes in phase difference and transmittance in the process of transfer after it has been patterned and processed into a photomask and, hence, much improved in terms of practical utility, because its optical characteristics have previously been varied as shown in FIG. 16 and reached a certain stable level.

Figure 1E:
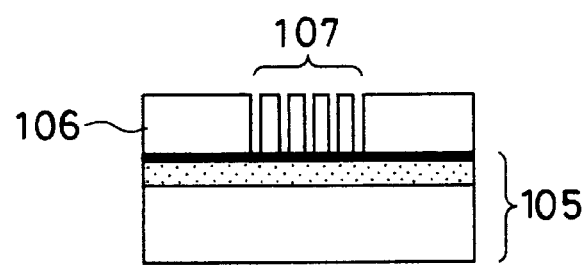

Next, the step of patterning and processing this halftone phase shift photomask blank into a photomask is now explained. As shown in FIG. 1(e), a commercially available electron beam resist (ZEP7000, Nippon Zeon Co., Ltd.) is coated on the halftone phase shift photomask blank 105 at a post-baking thickness of 300 nm, and subsequently baked at 110° C. for 20 minutes to obtain an electron beam resist film 106. Then, using an electron beam lithography system for photomasks, a latent image in the desired pattern is obtained. Finally, this latent image is developed with a dedicated developing solution ZED500 to obtain the desired resist pattern 107.

Using this resist pattern 107 as a mask, reactive ion etching is carried out under the following conditions for the dry etching of halftone phase shift film 102 (FIG. 1(a)).

Figure 1F:

Etching system: Parallel-plate reactive ion etcher
Gases and flow rates: Dichloromethane 30 sccm plus oxygen 60 sccm
Etching pressure: 200 millitorr
Etching power: 300 watts After completion of etching, the halftone phase shift film is surface treated with ozone while irradiated with ultraviolet radiation to remove an unnecessary portion of the resist, thereby obtaining such a halftone phase shift photomask 108 as shown in FIG. 1(f).

The thus obtained halftone phase shift photomask 108 is much reduced in terms of phase difference and transmittance changes in the process of transfer and, hence, much improved in terms of practical utility, because it is fabricated using the blank with stabilized optical characteristics as shown in FIG. 9.

EXAMPLE 2

Figure 2A:
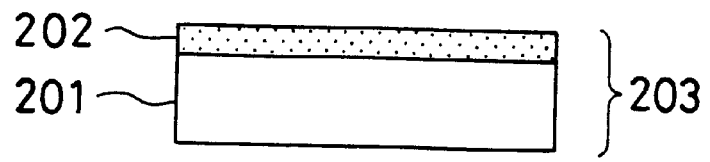
FIGS. 2(a) through 2(d) are illustrative of steps of fabricating a halftone phase shift photomask according to Example 2 of the invention.

In this example, another halftone phase shift photomask according to the present invention is explained with reference to FIGS. 2(a) through 2(d). As shown in FIG. 2(a), a halftone phase shift film 202 containing chromium and fluorine is formed on an optically polished, well-washed synthetic quartz substrate 201 by means of sputtering under the following conditions, thereby obtaining a halftone phase shift photomask blank 203.

Sputtering system: DC magnetron sputtering system
Target: Metallic chromium
Gases and flow rates: argon gas 76 sccm plus carbon tetrafluoride gas 24 sccm
Sputtering pressure: 3.0 millitorr
Sputtering current: 5.5 amperes Here the formed halftone phase shift film 202 had a thickness of 135 nm.

Figure 2B:
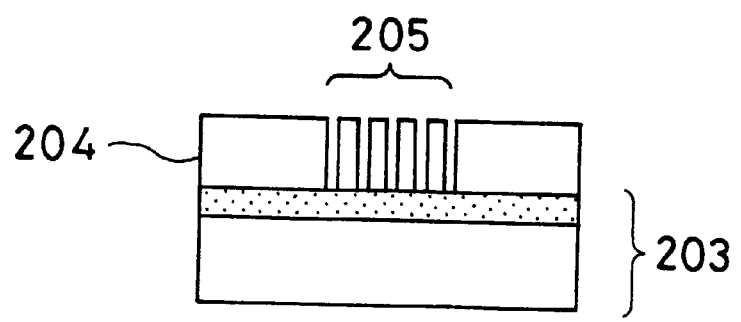

Then, as shown in FIG. 2(b), a commercially available electron beam resist (ZEP7000, Nippon Zeon Co., Ltd.) is coated on this blank 203 at a post-baking thickness of 300 nm, and subsequently baked at 110° C. for 20 minutes to obtain an electron beam resist film 204. Then, using an electron beam lithography system for photomasks, a latent image in the desired pattern is obtained. Finally, this latent image is developed with a dedicated developing solution ZED500 to obtain the desired resist pattern 205.

Using this resist pattern 205 as a mask, reactive ion etching is carried out under the following conditions for the dry etching of halftone phase shift film 202 (FIG. 2(a)).

Figure 2C:
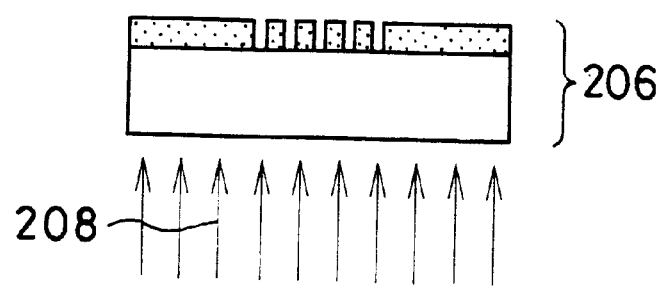

Etching system: Parallel-plate reactive ion etcher
Gases and flow rates: Dichloromethane 30 sccm plus oxygen 60 sccm
Etching pressure: 200 millitorr
Etching power: 300 watts After completion of etching, the halftone phase shift film is surface treated with ozone while irradiated with ultraviolet radiation to remove an unnecessary portion of the resist, thereby obtaining such a halftone phase shift photomask 206 as shown in FIG. 2(c).

Figure 2D:
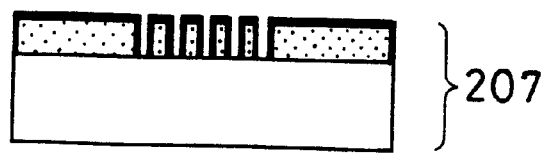

Next, this halftone phase shift photomask 206 is well washed, and then irradiated with laser light 208 of 193 nm wavelength from the irradiator shown in FIG. 8, as in Example 1, thereby obtaining such a halftone phase shift photomask 207 as shown in FIG. 2(d), which can be used while its optical characteristic changes are much reduced. The irradiation is carried out under the same conditions as in Example 1.

The thus obtained halftone phase shift photomask 207 is much reduced in terms of the changes in phase difference and transmittance in the process of transfer and, hence, much improved in terms of practical utility, because its optical characteristics have previously been varied as shown in FIG. 16 and reached a certain stable level.

EXAMPLE 3

Figure 3A:
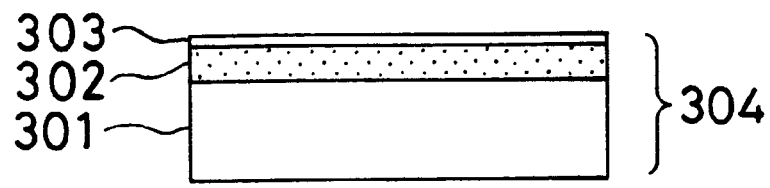
FIGS. 3(a) through 3(d) are illustrative of steps of fabricating a halftone phase shift mask blank according to Example 3 of the invention, and steps of processing the blank to obtain a halftone phase shift photomask.

Examples of the halftone phase shift photomask blank and halftone phase shift photomask according to the present invention are explained with reference to FIGS. 3(a) through 3(d). As shown in FIG. 3(a), a halftone phase shift film 302 containing chromium and fluorine is formed on an optically polished, well-washed synthetic quartz substrate 301 by means of sputtering under the following conditions.

Sputtering system: DC magnetron sputtering system
Target: Metallic chromium
Gases and flow rates: Argon gas 76 sccm plus carbon tetrafluoride gas 24 sccm
Sputtering pressure: 3.0 millitorr
Sputtering current: 5.5 amperes Here the formed halftone phase shift film 302 had a thickness of 130 nm.

Subsequently, an $SiO_2$ protective film 303 is formed on the halftone phase shift film 302 under the following conditions, thereby obtaining a halftone phase shift photomask blank 304.

Sputtering system: RF magnetron sputtering system
Target: Silicon dioxide
Gases and flow rates: Argon gas 50 sccm
Sputtering pressure: 3.0 millitorr
Sputtering power: 1 kilowatt Here the formed protective film 303 had a thickness of 20 nm.

Figure 3B:
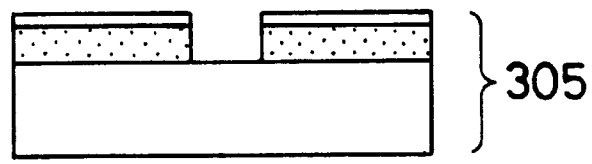

Apart from this, a sample 305 for measuring phase difference and transmittance, as shown in FIG. 3(b), was prepared by forming the halftone phase shift film 302 and protective film 303 on the synthetic quartz substrate 301 at the same thickness under the same conditions, and patterning the protecting film 303 and halftone phase shift film 302 by conventional lithography. By measurement on a commercially available phase shift mask phase difference meter (MPM193, Laser Tech Co., Ltd.), the phase difference and transmittance at 193 nm wavelength of the halftone phase shift film was found to be about 180° and about 12%, respectively.

Figure 10:
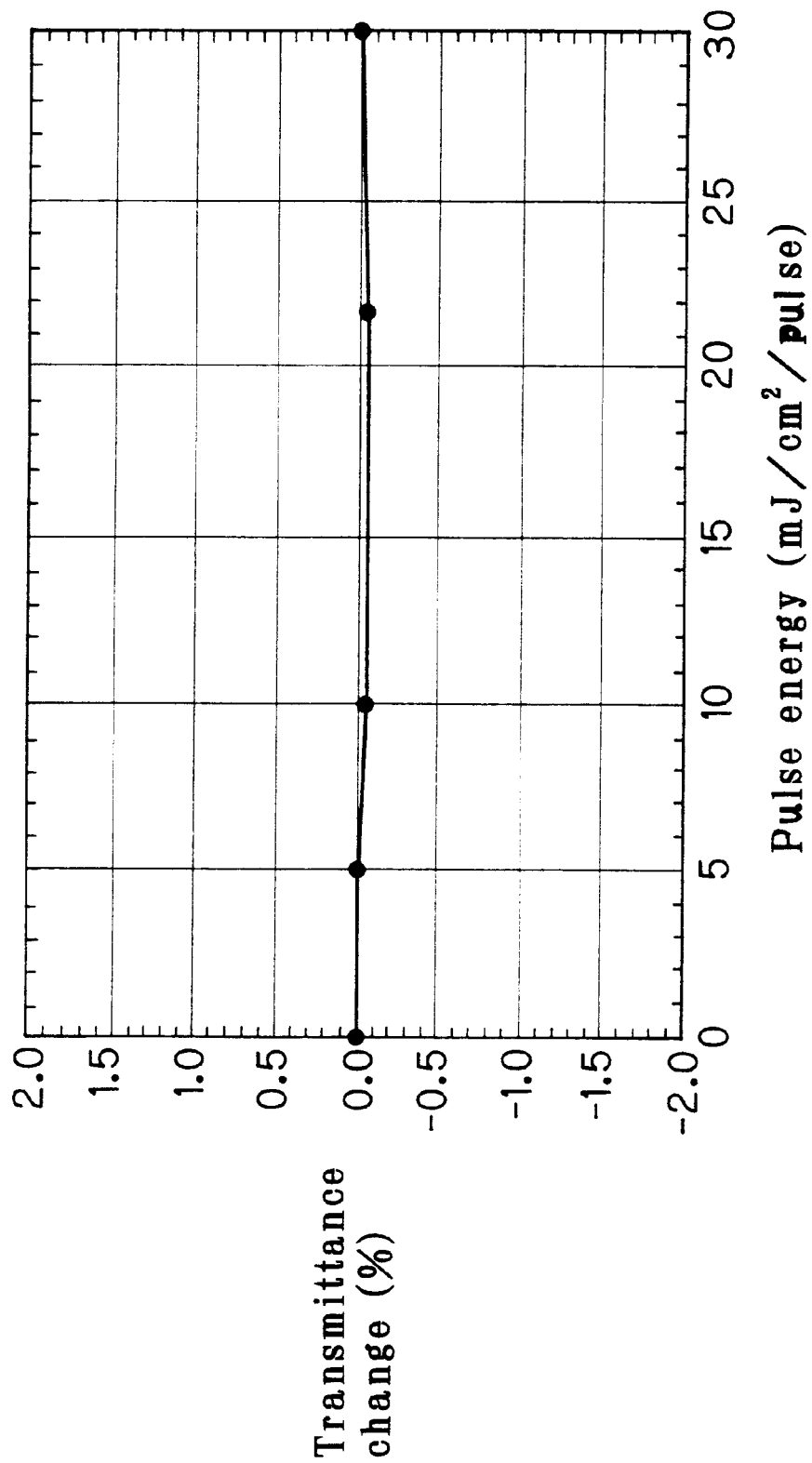
FIG. 10 is a graphical representation illustrative of the results of experimentation on the resistance to ArF excimer laser irradiation of the halftone phase shift photomask according to Example 3 of the invention.

Changes in the transmittance of the thus obtained halftone phase shift photomask blank 304 due to ArF excimer laser irradiation are shown in FIG. 10. It is found that this halftone phase shift photomask blank 304 is much reduced in terms of the changes in phase difference and transmittance in the process of transfer after it has been patterned and processed into a photomask and, hence, much improved in terms of practical utility, because such surface composition changes as shown in Table 1 do not occur in the process of transfer, and because the optical characteristics changes shown in FIG. 16 are prevented by the provision of the protective film on the surface thereof.

Figure 3C:
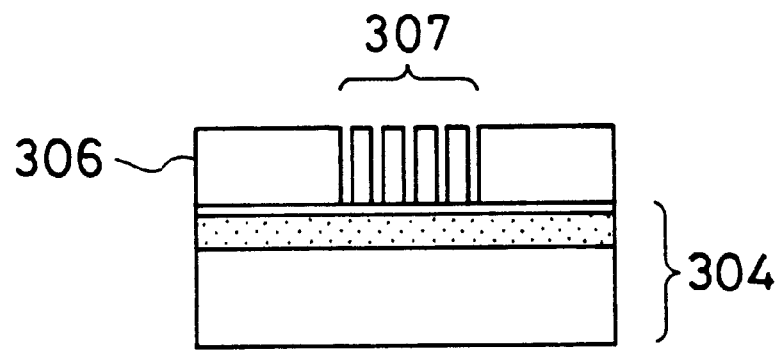

Next, the step of patterning and processing this halftone phase shift photomask blank 304 into a photomask is explained. As shown in FIG. 3(c), a commercially available electron beam resist (ZEP7000, Nippon Zeon Co., Ltd.) is coated on the halftone phase shift photomask blank 304 at a post-baking thickness of 300 nm, and subsequently baked at 110° C. for 20 minutes to obtain an electron beam resist film 306. Then, using an electron beam lithography system for photomasks, a latent image in the desired pattern is obtained. Finally, this latent image is developed with a dedicated developing solution ZED500 to obtain the desired resist pattern 307.

Using this resist pattern 307 as a mask, reactive ion etching is carried out under the following two sets of conditions for the continuous dry etching of protective film 303 and halftone phase shift film 302 (FIG. 3(a)).

Figure 3D:

Etching system: Parallel-plate reactive ion etcher
Conditions 1:
  Gas and flow rate: Carbon tetrafluoride 100 sccm
  Etching pressure: 200 millitorr
  Etching power: 300 watts
Conditions 2:
  Gases and flow rates: Dichloromethane 30 sccm plus oxygen 60 sccm
  Etching pressure: 200 millitorr
  Etching power: 300 watts After completion of etching, the halftone phase shift film is surface treated with ozone while irradiated with ultraviolet radiation to remove an unnecessary portion of the resist, thereby obtaining such a halftone phase shift photomask 308 as shown in FIG. 3(d).

The thus obtained halftone phase shift photomask 308 is much reduced in terms of the changes in phase difference and transmittance in the process of transfer and, hence, much improved in terms of practical utility, because the optical characteristic changes shown in FIG. 16 are prevented by the formation of the protective film on the surface thereof.

EXAMPLE 4

Figure 4A:
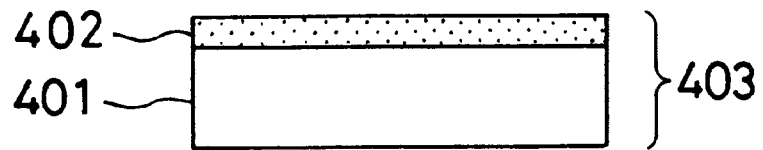
FIGS. 4(a) through 4(d) are illustrative of steps of fabricating a halftone phase shift photomask according to Example 4 of the invention.

In this example, a further halftone phase shift photomask according to the present invention is explained with reference to FIGS. 4(a) through 4(d). As shown in FIG. 4(a), a halftone phase shift film 402 containing chromium and fluorine is formed on an optically polished, well-washed synthetic quartz substrate 401 by means of sputtering under the following conditions, thereby obtaining a halftone phase shift photomask blank 403.

Sputtering system: DC magnetron sputtering system
Target: Metallic chromium
Gases and flow rates: Argon gas 76 sccm plus carbon tetrafluoride gas 24 sccm
Sputtering pressure: 3.0 millitorr
Sputtering current: 5.5 amperes Here the formed halftone phase shift film 402 had a thickness of 135 nm.

Figure 4B:
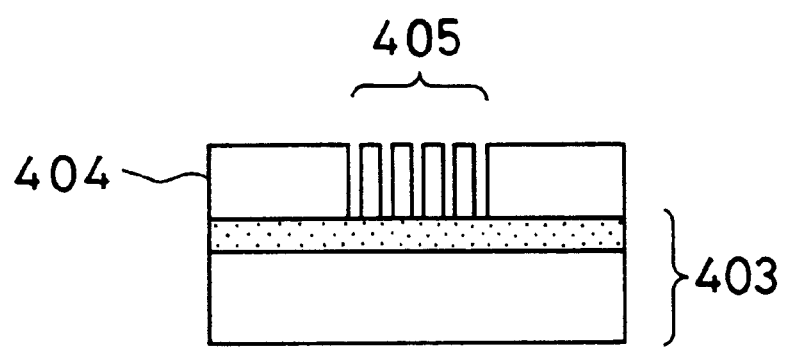
Figure 4C:
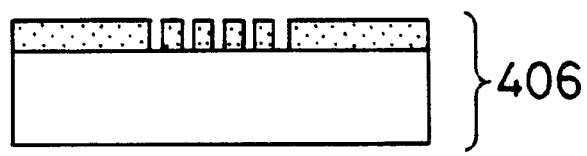
Figure 4D:
Figure 5A:
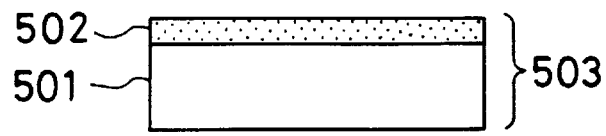
FIGS. 5(a) through 5(e) are illustrative of steps of fabricating a halftone phase shift photomask according to Example 5 of the invention.
Figure 5B:
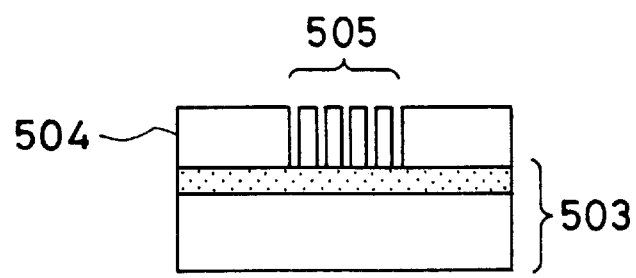
Figure 5C:
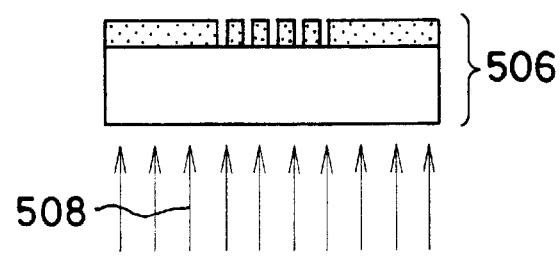
Figure 5D:
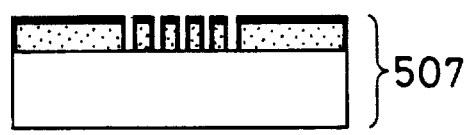
Figure 5E:
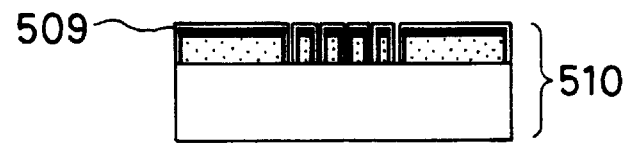
Figure 6A:
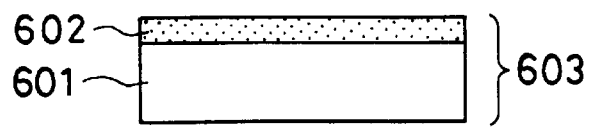
FIGS. 6(a) through 6(f) are illustrative of steps of fabricating a halftone phase shift photomask according to Example 6 of the invention.
Figure 6B:
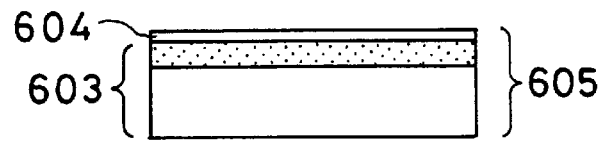
Figure 6C:
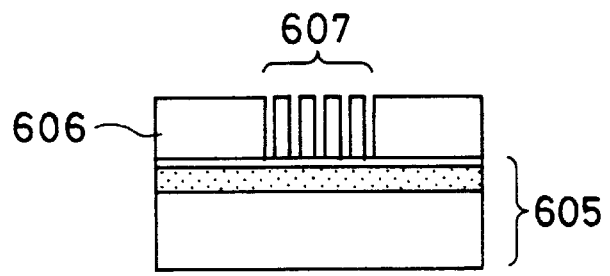
Figure 6D:
Figure 6E:
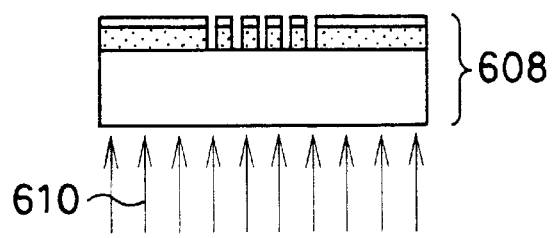
Figure 6F:
Figure 7A:
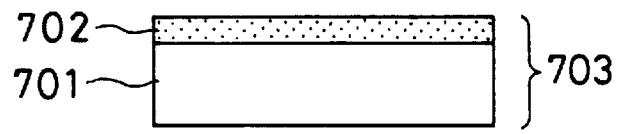
FIGS. 7(a) through 7(e) are illustrative of steps of fabricating a halftone phase shift photomask according to Example 7 of the invention.
Figure 7B:
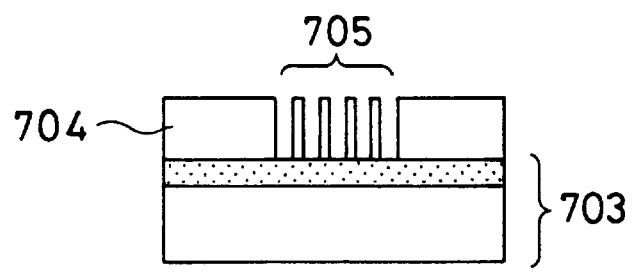
Figure 7C:
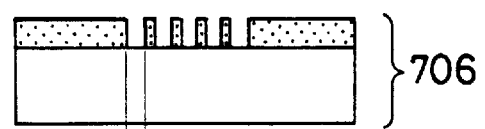
Figure 7D:
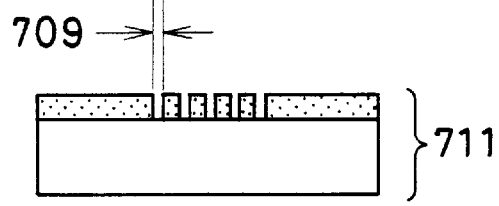
Figure 7E:

Then, as shown in FIG. 4(b), a commercially available electron beam resist (ZEP7000, Nippon Zeon Co., Ltd.) is coated on the this blank 403 at a post-baking thickness of 300 nm, and subsequently baked at 110° C. for 20 minutes to obtain an electron beam resist film 404. Then, using an electron beam lithography system for photomasks, a latent image in the desired pattern is obtained. Finally, this latent image is developed with a dedicated developing solution ZED500 to obtain the desired resist pattern 405.

Using this resist pattern 405 as a mask, reactive ion etching is carried out under the following conditions for the dry etching of halftone phase shift film 402 (FIG. 4(a)).

Etching system: Parallel-plate reactive ion etcher

Gases and flow rates: Dichloromethane 30 sccm plus oxygen 60 sccm

Etching pressure: 200 millitorr

Etching power: 300 watts

After completion of etching, the halftone phase shift film is surface treated with ozone while irradiated with ultraviolet radiation to remove an unnecessary portion of the resist, thereby obtaining such a halftone phase shift photomask 406 as shown in FIG. 4(*c*).

Then, as shown in FIG. 4(*d*), a protective film 407 is formed on this halftone phase shift photomask 406 under the following conditions, thereby obtaining a halftone phase shift photomask 408 with the protective film attached thereto.

Sputtering system: RF magnetron sputtering system

Target: Silicon dioxide

Gas and flow rate: Argon gas 50 sccm

Sputtering pressure: 3.0 millitorr

Sputtering power: 1 kilowatt

Here the formed protective film 407 had a thickness of 20 nm.

The thus obtained halftone phase shift photomask 408 is much reduced in terms of the phase difference and transmittance changes in the process of transfer and, hence, much improved in terms of practical utility, because it is fabricated using the blank having stable optical characteristics with respect to ArF excimer laser irradiation, as shown in FIG. 10.

EXAMPLE 5

In this example, a further halftone phase shift photomask according to the present invention is explained with reference to FIGS. 5(*a*) through 5(*e*). As shown in FIG. 5(*a*) and as in Example 2, a halftone phase shift film 502 containing chromium and fluorine is formed on an optically polished, well-washed synthetic quartz substrate 501 by means of sputtering under the following conditions, thereby obtaining a halftone phase shift photomask blank 503.

Sputtering system: DC magnetron sputtering system

Target: Metallic chromium

Gases and flow rates: Argon gas 76 sccm plus carbon tetrafluoride gas 24 sccm

Sputtering pressure: 3.0 millitorr

Sputtering current: 5.5 amperes

Here the formed halftone phase shift film 502 had a thickness of 135 nm.

Then, as shown in FIG. 5(*b*), a commercially available electron beam resist (ZEP7000, Nippon Zeon Co., Ltd.) is coated on this blank 503 at a post-baking thickness of 300 nm, and subsequently baked at 110° C. for 20 minutes to obtain an electron beam resist film 504. Then, using an electron beam lithography system for photomasks, a latent image in the desired pattern is obtained. Finally, this latent image is developed with a dedicated developing solution ZED500 to obtain the desired resist pattern 505.

Using this resist pattern 505 as a mask, reactive ion etching is carried out under the following conditions for the dry etching of halftone phase shift film 502 (FIG. 5(*a*)).

Etching system: Parallel-plate reactive ion etcher

Gases and flow rates: Dichloromethane 30 sccm plus oxygen 60 sccm

Etching pressure: 200 millitorr

Etching power: 300 watts

After completion of etching, the halftone phase shift film is surface treated with ozone while irradiated with ultraviolet radiation to remove an unnecessary portion of the resist, thereby obtaining such a halftone phase shift photomask 506 as shown in FIG. 5(*c*).

Next, this halftone phase shift photomask 506 is well washed, and then irradiated with laser light 208 of 193 nm wavelength from the irradiator shown in FIG. 8, as in Examples 1 and 2, thereby obtaining such a halftone phase shift photomask 507 as shown in FIG. 5(*d*), which can be used while its optical characteristic changes are much reduced. The irradiation is carried out under the same conditions as in Examples 1 and 2.

Then, as shown in FIG. 5(*e*), an $SiO_2$ protective film 509 is formed on the whole surface of this halftone phase shift photomask 507 under the following conditions, thereby obtaining a halftone phase shift photomask 510 with the protective film attached thereto.

Sputtering system: RF magnetron sputtering system

Target: Silicon dioxide

Gas and flow rate: Argon gas 50 sccm

Sputtering pressure: 3.0 millitorr

Sputtering power: 1 kilowatt

Here the formed protective film 509 had a thickness of 20 nm.

The thus obtained halftone phase shift photomask 510 is much reduced in terms of the changes in phase difference and transmittance in the process of transfer and, hence, much improved in terms of practical utility, because the optical characteristic changes shown in FIG. 16 are prevented by the formation of the protective film 509 on the surface thereof.

EXAMPLE 6

In this example, a further halftone phase shift photomask according to the present invention is explained with reference to FIGS. 6(*a*) through 6(*f*). As shown in FIG. 6(*a*) and as in Example 2, a halftone phase shift film 602 containing chromium and fluorine is formed on an optically polished, well-washed synthetic quartz substrate 601 by means of sputtering under the following conditions, thereby obtaining a halftone phase shift photomask blank 603.

Sputtering system: DC magnetron sputtering system

Target: Metallic chromium

Gases and flow rates: Argon gas 76 sccm plus carbon tetrafluoride gas 24 sccm

Sputtering pressure: 3.0 millitorr

Sputtering current: 5.5 amperes

Here the formed halftone phase shift film 602 had a thickness of 130 nm.

Subsequently, an $SiO_2$ protective film 604 is formed on the halftone phase shift film under the following conditions as shown in FIG. 6(*b*), thereby obtaining a halftone phase shift photomask blank 605.

Sputtering system: RF magnetron sputtering system

Target: Silicon dioxide

Gases and flow rates: Argon gas 50 sccm

Sputtering pressure: 3.0 millitorr

Sputtering power: 1 kilowatt

Here the formed protective film 604 had a thickness of 20 nm.

Next, as shown in FIG. 6(*c*), a commercially available electron beam resist (ZEP7000, Nippon Zeon Co., Ltd.) is coated on the halftone phase shift photomask blank 605 at a post-baking thickness of 300 nm, and subsequently baked at 110° C. for 20 minutes to obtain an electron beam resist film 606. Then, using an electron beam lithography system for photomasks, a latent image in the desired pattern is obtained. Finally, this latent image is developed with a dedicated developing solution ZED500 to obtain the desired resist pattern 607.

Using this resist pattern 607 as a mask, reactive ion etching is carried out under the following two sets of conditions for the continuous dry etching of protective film 604 and halftone phase shift film 602 (FIG. 6(*a*) and 6(*b*)).

Etching system: Parallel-plate reactive ion etcher
Conditions 1:
  Gases and flow rates: Carbon tetrafluoride 100 sccm
  Etching pressure: 200 millitorr
  Etching power: 300 watts
Conditions 2:
  Gases and flow rates: Dichloromethane 30 sccm plus oxygen 60 sccm
  Etching pressure: 200 millitorr
  Etching power: 300 watts After completion of etching, the halftone phase shift film is surface treated with ozone while irradiated with ultraviolet radiation to remove an unnecessary portion of the resist, thereby obtaining such a halftone phase shift photomask 608 as shown in FIG. 6(*d*).

Further, the halftone phase shift photomask 608 is well-washed, and then irradiated with laser light 610 of 193 nm wavelength from the irradiator shown in FIG. 8, as in Example 1, thereby obtaining such a halftone phase shift mask 609 as shown in FIG. 6(*f*), which can be used while it is much reduced in terms of optical characteristic changes. The irradiation is carried out under the same conditions as in Example 1.

The thus obtained halftone phase shift photomask 609 is much reduced in terms of phase difference and transmittance in the process of transfer and, hence, much improved in terms of practical utility, because the optical characteristic changes shown in FIG. 6 have previously be varied until a certain stable level has been reached.

EXAMPLE 7

In this example, a further halftone phase shift photomask blank according to the present invention is explained with reference to FIGS. 7(*a*) through 7(*e*). As shown in FIG. 7(*a*) and as in Example 2, a halftone phase shift film 702 containing chromium and fluorine is formed on an optically polished, well-washed synthetic quartz substrate 701 by means of sputtering under the following conditions, thereby obtaining a halftone phase shift photomask blank 703.

Sputtering system: DC magnetron sputtering system
Target: Metallic chromium
Gases and flow rates: Argon gas 76 sccm plus carbon tetrafluoride gas 24 sccm
Sputtering pressure: 3.0 millitorr
Sputtering current: 5.5 amperes Here the formed halftone phase shift film 702 had a thickness of 135 nm.

Then, as shown in FIG. 7(*b*), a commercially available electron beam resist (ZEP7000, Nippon Zeon Co., Ltd.) is coated on this blank 703 at a post-baking thickness of 300 nm, and subsequently baked at 110° C. for 20 minutes to obtain an electron beam resist film 704. Then, using an electron beam lithography system for photomasks, a latent image in the desired pattern is formed, provided however that the size of openings in the pattern is larger than the original opening size. Finally, this latent image is developed with a dedicated developing solution ZED500 to obtain a resist pattern 705 having an opening portion larger than the desired opening size.

Using this resist pattern 705 as a mask, reactive ion etching is carried out under the following conditions for the dry etching of halftone phase shift film 702 (FIG. 7(*a*)).

Etching system: Parallel-plate reactive ion etcher
Gases and flow rates: Dichloromethane 30 sccm plus oxygen 60 sccm
Etching pressure: 200 millitorr
Etching power: 300 watts After completion of etching, the halftone phase shift film is surface treated with ozone while irradiated with ultraviolet radiation to remove an unnecessary portion of the resist, thereby obtaining such a halftone phase shift photomask 706 as shown in FIG. 7(*c*). This halftone phase shift photomask 706 has an opening portion 710 larger than the desired size of an opening portion 709 in a halftone phase shift photomask 711 as shown in FIG. 7(*d*).

Subsequently, a protective film 704 is formed on the halftone phase shift photomask 706 under the following conditions as shown in FIG. 7(*e*), thereby obtaining a halftone phase shift photomask 708 with the protective film attached thereto.

Sputtering system: RF magnetron sputtering system
Target: Silicon dioxide
Gases and flow rates: Argon gas 50 sccm
Sputtering pressure: 3.0 millitorr
Sputtering power: 1 kilowatt Here it is noted that the protective film 707 should be formed at such a thickness that the aforesaid opening portion has the desired patterning opening size by deposition of the protective film onto the pattern section.

In this example, the desired opening size could be obtained by patterning the halftone phase shift film 702 while the opening size was 20 nm larger than the desired value on each side, and forming the protective film 707 at a thickness of 50 nm.

The thus obtained halftone phase shift photomask 708 is much reduced in terms of phase difference and transmittance changes in the process of transfer and, hence, much improved in terms of practical utility, because the optical characteristic changes shown in FIG. 16 are prevented by the formation of the protective film 707 on the surface thereof.

EXAMPLE 8

Figure 11:
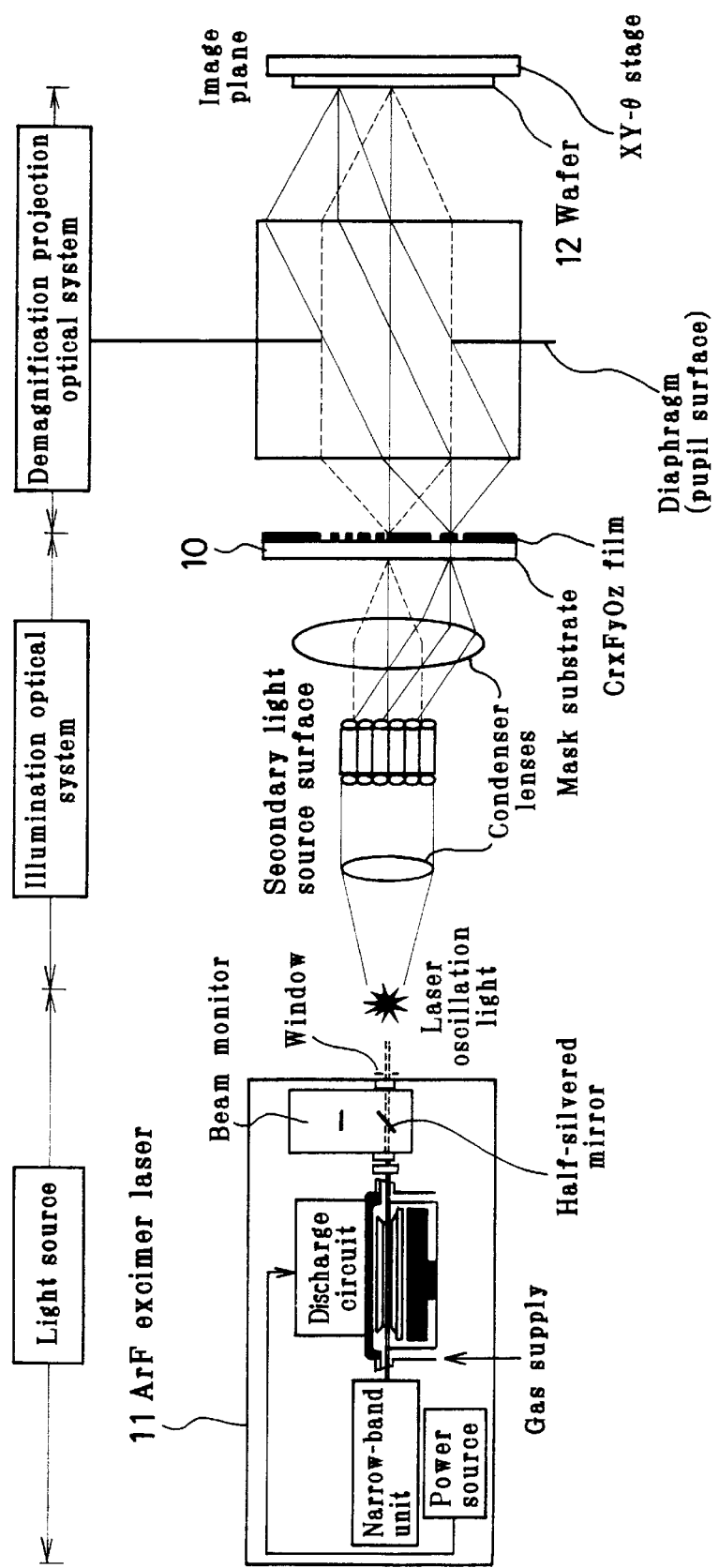
FIG. 11 is illustrative of one construction of an aligner used at a resist pattern-formation step in Example 8 of the invention.

In this example, how to form a resist pattern on a wafer using the halftone phase shift photomask of the present invention is explained with reference to FIG. 11. A halftone phase shift photomask 10 according to the present invention was positioned in a semiconductor aligner of such construction as shown in FIG. 11. Then, a halftone mask pattern was projected onto a wafer 12 on which a resist was coated using an ArF excimer laser 11 of 193 nm wavelength. The wafer 12 was coated thereon with DUV-30, Nissan Chemical Industries, Ltd., then baked at a given temperature, then coated thereon with ZAF001, Nippon Zeon Co., Ltd., and finally baked at a given temperature. After this, the wafer was exposed to light using a 193 nm wavelength ArF excimer laser aligner of FIG. 11, followed by backing at a given temperature, and development.

With a pattern having a target size of 0.15 $\mu$m in mind, exposure was carried out over an extended period of time. However, there were no noticeable changes in size and focal depth.

Figure 12:
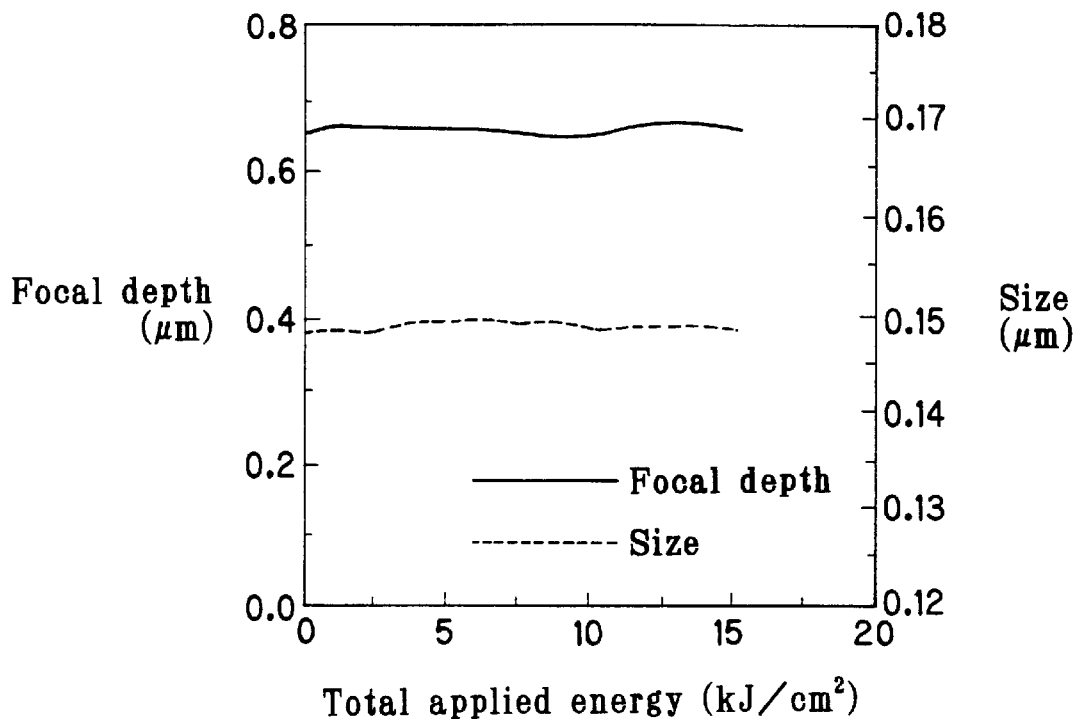
FIG. 12 is a graphical representation illustrative of the results of experimentation wherein the resist pattern of Example 8 was formed using the halftone phase shift photomask according to Example 1 of the invention.
Figure 13:
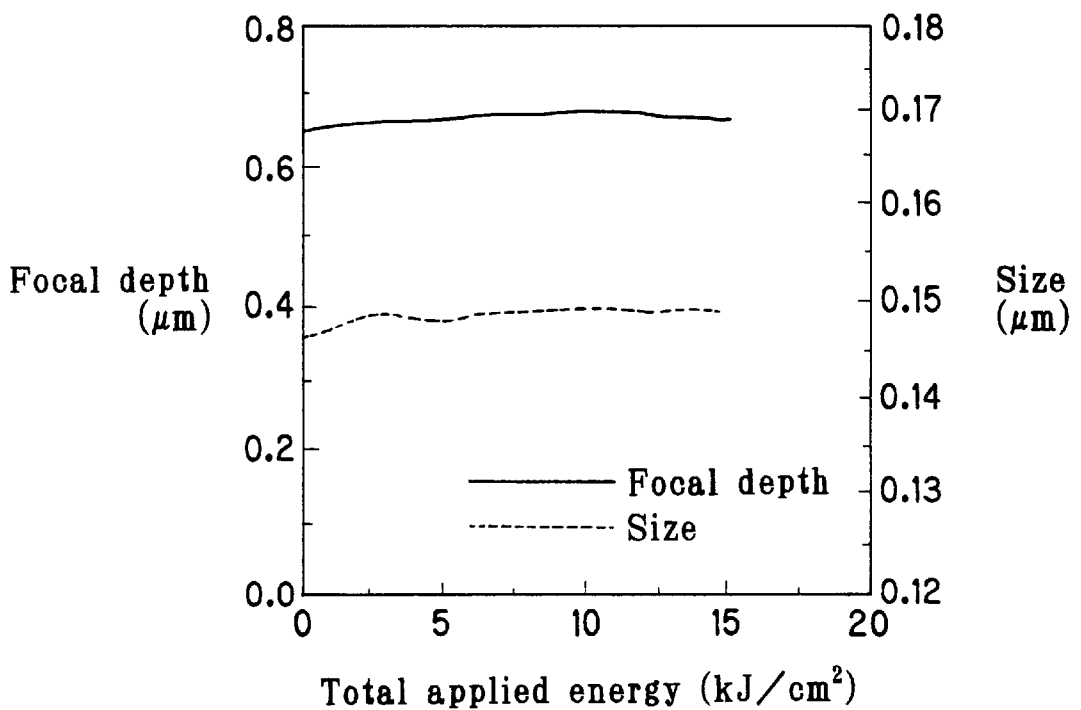
FIG. 13 is a graphical representation illustrative of the results of experimentation wherein the resist pattern of Example 8 was formed using the halftone phase shift photomask according to Example 3 of the invention.
Figure 14A:
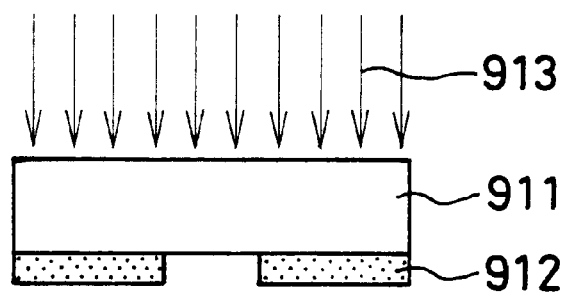
FIGS. 14(a) through 14(d) are illustrative of the principles of halftone phase shift lithography.
Figure 14B:
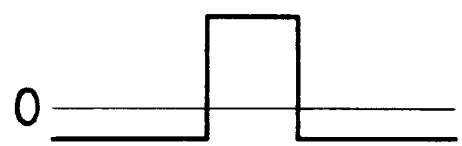
Figure 14C:
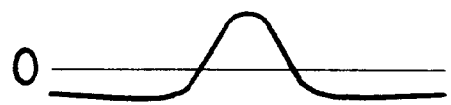
Figure 14D:
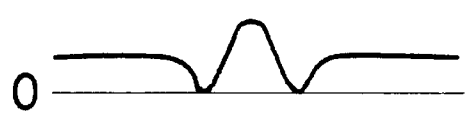
Figure 15A:
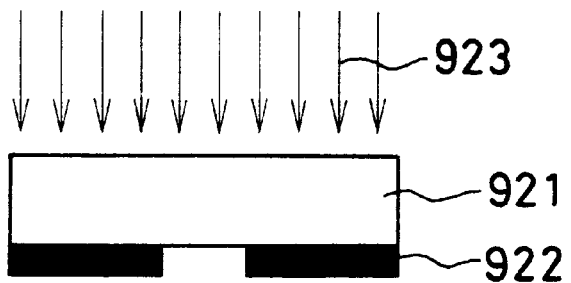
FIGS. 15(a) through 15(d) are illustrative of conventional lithography as compared with FIGS. 14(a) through 14(d).
Figure 15B:
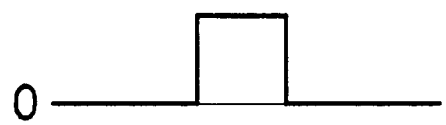
Figure 15C:
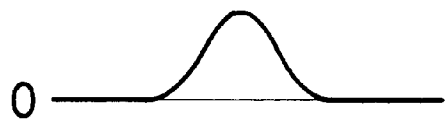
Figure 15D:
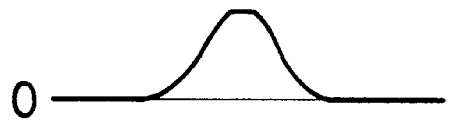

FIG. 12 is a graphical representation illustrative of the results of transfer using the halftone phase shift photomask of Example 1 of the invention, and FIG. 13 is a graphical representation illustrative of the results of transfer using the halftone phase shift photomask of Example 3.

The quantity of light exposed to the mask of the present invention is 15 kJ/cm$^2$ amounting to a 1.5 year worth of usual semiconductor exposure. This implies that the robustness of the halftone mask can be ensured by irradiation with energy radiation.

POSSIBILITY OF UTILIZATION IN INDUSTRY

According to the present invention, as can be understood from the foregoing explanation, a halftone phase shift film—which may be modified by irradiation with exposure light while actually used—is modified before put to practical use and/or a protective film for preventing such modification is provided, so that changes in phase difference and transmittance while the mask is used can be much reduced. It is thus possible to achieve practically much improved halftone phase shift photomasks and blanks therefor.

We claim:

1. A halftone phase shift mask blank comprising a halftone phase shift film containing at least chromium and fluorine on a transparent substrate, wherein:
   a protective film has been provided on said halftone phase shift mask to reduce optical characteristic changes upon irradiation with an exposure excimer laser,
   wherein the protective film contains at least chromium and fluorine with the content of fluorine being smaller than that in the halftone phase shift mask.

2. A halftone phase shift mask blank comprising a halftone phase shift film containing at least chromium and fluorine on a transparent substrate, wherein:
   optical characteristic changes upon irradiation with an exposure excimer laser have been reduced by application of light of a wavelength substantially absorbed by said halftone phase shift film, and provision of a protective layer on said halftone phase shift mask,
   wherein the protective film contains at least chromium and fluorine with the content of fluorine being smaller than that in the halftone phase shift mask.

3. The halftone phase shift mask blank according to claim 2, wherein a stabilized film has been formed on the surface of the halftone phase shift film by the application of light having a wavelength substantially absorbed by the halftone phase shift mask.

4. The halftone phase shift mask blank according to any one of claims 1 to 3, wherein the protective film is a transparent film.

5. The halftone phase shift mask blank according to claim 4, wherein the protective film is mainly made up of a silicon oxide.

6. The halftone phase shift mask blank according to any one of claims 1, 2, and 3, wherein the protective film is mainly made up of a silicon oxide.

7. A halftone phase shift mask comprising a halftone phase shift film pattern containing at least chromium and fluorine on a transparent substrate, wherein:
   optical characteristic changes upon irradiation with an exposure excimer laser have been reduced by provision of a protective film pattern on said halftone phase shift film,
   wherein the protective film contains at least chromium and fluorine with the content of fluorine being smaller than that in the halftone phase shift mask.

8. A halftone phase shift mask having a halftone phase shift film pattern containing at least chromium and fluorine on a transparent substrate, wherein:
   optical characteristic changes upon irradiation with an exposure excimer laser have been reduced by provision of a protective film on the whole surface of said mask after patterning of said halftone phase shift film,
   wherein the protective film contains at least chromium and fluorine with the content of fluorine being smaller than that in the halftone phase shift mask.

9. A halftone phase shift mask comprising a halftone phase shift film pattern containing at least chromium and fluorine on a transparent substrate, wherein;
   optical characteristic changes upon irradiation with an exposure excimer laser have been reduced by patterning of a film irradiated with light having a wavelength substantially absorbed by said halftone phase shift film, and wherein the optical characteristic change upon irradiation with an exposure excimer laser have been reduced by applying the light having a wavelength substantially absorbed by the halftone phase shift film, then providing a protective film thereon, and finally patterning the protective film and halftone phase shift film,
   wherein the protective film contains at least chromium and fluorine with the content of fluorine being smaller than that in the halftone phase shift mask.

10. A halftone phase shift mask comprising a halftone phase shift film pattern containing at least chromium and fluorine on a transparent substrate, wherein:
    optical characteristic changes upon irradiation with an exposure excimer laser have been reduced by patterning of a film irradiated with light having a wavelength substantially absorbed by said halftone phase shift film, and wherein the optical characteristic changes upon irradiation with an exposure excimer laser have been reduced by applying the light having a wavelength substantially absorbed by the halftone phase shift film, then patterning the film, and finally providing a protective film on the whole surf ace thereof,
    wherein the protective film contains at least chromium and fluorine with the content of fluorine being smaller than that in the halftone phase shift mask.

11. A halftone phase shift mask comprising a halftone phase shift film pattern containing at least chromium and fluorine on a transparent substrate, wherein:
    optical characteristic changes upon irradiation with an exposure excimer laser have been reduced by application of light having a wavelength substantially absorbed by said halftone phase shift film after patterning of said halftone phase shift film, and wherein the optical characteristic changes upon irradiation with an exposure laser have been reduced by irradiating a patterned halftone phase shift film with the light having a wavelength substantially absorbed by said film, and then providing a protective film on the whole surface thereof,
    wherein the protective film contains at least chromium and fluorine with the content of fluorine being smaller than that in the halftone phase shift mask.

12. The halftone phase shift mask according to any one of claims 9, 10 and 11, wherein a stabilized film has been formed on the surface of the halftone phase shift film in contact with outside air by the application of the light having a wavelength substantially absorbed by said halftone phase shift film.

13. The halftone phase shift mask according to claim 12, wherein the protective film is a transparent film.

14. The halftone phase shift mask according to claim 12, wherein the protective film is a film mainly made up of a silicon oxide.

15. The halftone phase shift mask according to claim 12, wherein a pattern is formed with pattern size smaller than target size.

16. A pattern formation process using the halftone phase shift mask according to claim 12.

17. The halftone phase shift mask according to any one of claims 7 to 11, wherein the protective film is a transparent film.

18. The halftone phase shift mask according to claim 17, wherein the protective film is a film mainly made up of a silicon oxide.

19. The halftone phase shift mask according to claim 17, wherein a pattern is formed with pattern size smaller than target size.

20. A pattern formation process using the halftone phase shift mask according to claim 17.

21. The halftone phase shift mask according to any one of claims 7 to 11, wherein the protective film is a film mainly made up of a silicon oxide.

22. The halftone phase shift mask according to claim 21, wherein a pattern is formed with pattern size smaller than target size.

23. A pattern formation process using the halftone phase shift mask according to claim 21.

24. The halftone phase shift mask according to any one of claims 7, 10 or 11, wherein a pattern is formed with pattern size smaller than target size.

25. A pattern formation process using the halftone phase shift mask according to claim 24.

26. A pattern formation process using the halftone phase shift mask according to any one of claims 7 to 11.

* * * * *